United States Patent
Suen et al.

(10) Patent No.: US 11,107,759 B2
(45) Date of Patent: Aug. 31, 2021

(54) CHIP PACKAGE AND MANUFACTURING METHOD THEREOF

(71) Applicant: XINTEC INC., Taoyuan (TW)

(72) Inventors: Wei-Luen Suen, Taoyuan (TW);
Jiun-Yen Lai, Taoyuan (TW);
Hsing-Lung Shen, Hsinchu (TW);
Tsang-Yu Liu, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 17/037,151

(22) Filed: Sep. 29, 2020

(65) Prior Publication Data

US 2021/0104455 A1 Apr. 8, 2021

Related U.S. Application Data

(60) Provisional application No. 62/910,171, filed on Oct. 3, 2019.

(51) Int. Cl.
*H01L 23/498* (2006.01)
*H01L 21/48* (2006.01)

(52) U.S. Cl.
CPC .... *H01L 23/49833* (2013.01); *H01L 21/4857* (2013.01); *H01L 23/49811* (2013.01); *H01L 23/49822* (2013.01)

(58) Field of Classification Search
CPC ......... H01L 23/49833; H01L 23/49811; H01L 23/49822; H01L 21/4857
See application file for complete search history.

(56) References Cited

U.S. PATENT DOCUMENTS

| | | | | |
|---|---|---|---|---|
| 2005/0230684 A1* | 10/2005 | Seo | ...................... | H01L 27/3248 257/72 |
| 2010/0096718 A1* | 4/2010 | Hynecek | ........... | H01L 27/14685 257/460 |
| 2011/0012164 A1* | 1/2011 | Kim | ...................... | H01L 33/387 257/99 |
| 2011/0120754 A1* | 5/2011 | Kondo | .............. | H01L 23/49833 174/254 |
| 2016/0197127 A1* | 7/2016 | Park | .................... | H01L 27/3223 257/40 |
| 2017/0047313 A1* | 2/2017 | Yang | ................. | H01L 23/49827 |
| 2019/0157582 A1* | 5/2019 | Yug | ...................... | H01L 51/5253 |
| 2019/0293980 A1* | 9/2019 | Inoue | .................. | H01L 27/1248 |
| 2020/0045829 A1* | 2/2020 | Matsuura | .......... | H01L 23/49822 |

* cited by examiner

*Primary Examiner* — Steven T Sawyer
(74) *Attorney, Agent, or Firm* — Liu & Liu

(57) ABSTRACT

A chip package includes a lower substrate, a first silicon nitride substrate, a bonding layer, an upper substrate, a first functional layer, a transparent conductive layer, an isolation layer, and a first conductive pad. The supporting layer is located between the lower substrate and the first silicon nitride substrate, and is made of a material including Benzocyclobutene (BCB). The upper substrate is located on the first silicon nitride substrate. The first functional layer is located between the upper substrate and the first silicon nitride substrate. The transparent conductive layer is located on the upper substrate. The isolation layer covers the upper substrate and the transparent conductive layer. The first conductive pad is located in the isolation layer and in electrical contact with the transparent conductive layer.

17 Claims, 12 Drawing Sheets

CHIP PACKAGE AND MANUFACTURING METHOD THEREOF

RELATED APPLICATION

This application claims priority to U.S. Provisional Application Ser. No. 62/910,171, filed Oct. 3, 2019, which is herein incorporated by reference in its entirety.

BACKGROUND

Field of Invention

The present invention relates to a chip package and a manufacturing method of the chip package.

Description of Related Art

Typically, chip packages used in optics may include chips with functional layers and translucent films set above and below the chip. The chip is bonded with the lower translucent film by a polymer layer with hygroscopic property. The polymer layer has a hollow structure. This makes a cavity between the chip and the lower translucent film, and may create moisture in the cavity, thus damaging the chip package. Moreover, film thickness of the translucent film is not specifically designed. Therefore, the film is prone to warpage caused by film stress. Furthermore, the location of the dummy pad of the chip package is also not specifically designed. This may cause a capacitance effect, and electrostatic and electrical stress may deconstruct the chip package. The issues put above make it difficult to improve product reliability.

SUMMARY

An aspect of the present invention is to provide a chip package.

According to an embodiment of the present invention, a chip package includes a lower substrate, a first silicon nitride substrate, a bonding layer, an upper substrate, a first functional layer, a transparent conductive layer, an isolation layer, and a first conductive pad. The bonding layer is located between the lower substrate and the first silicon nitride substrate, and made of a material comprising Benzocyclobutene (BCB). The upper substrate is located on the first silicon nitride substrate. The first functional layer is located between the upper substrate and the first silicon nitride substrate. The transparent conductive layer is located on the upper substrate. The isolation layer covers the upper substrate and the transparent conductive layer. The first conductive pad is located in the isolation layer and in electrical contact with the transparent conductive layer.

In an embodiment of the present invention, the bonding layer fills up the space between the lower substrate and the first silicon nitride substrate.

In an embodiment of the present invention, the bonding layer contacts the lower substrate and the first silicon nitride substrate.

In an embodiment of the present invention, the chip package further includes a second conductive pad located on the isolation layer. The normal projection of the second conductive pad on the upper substrate is spaced apart from the transparent conductive layer.

In an embodiment of the present invention, the second conductive pad and the transparent conductive layer are separated by the isolation layer.

In an embodiment of the present invention, the second conductive pad is electrically isolated from the transparent conductive layer.

In an embodiment of the present invention, the thickness of the lower substrate is greater than that of the upper substrate.

In an embodiment of the present invention, the chip package further includes a second silicon nitride substrate located between the bonding layer and the lower substrate, and a second functional layer located between the lower substrate and the second silicon nitride substrate.

In an embodiment of the present invention, the bonding layer fills up the space between the second nitride substrate and the first nitride substrate.

In an embodiment of the present invention, the thickness of the lower substrate is smaller than that of the upper substrate.

In an embodiment of the present invention, the chip package further includes an anti-reflection layer located on the top surface of the upper substrate and covered by the isolation layer and the transparent conductive layer.

In an embodiment of the present invention, materials of the upper substrate and lower substrate include fused silica.

In an embodiment of the present invention, the first conductive pad includes a titanium nitride layer, a titanium layer, a gold layer, and a silver (Ag) epoxy that are stacked in order.

In an embodiment of the present invention, the isolation layer includes a tetraethyl orthosilicate (TEOS) oxide layer, a silicon nitride layer, and an oxide layer that are stacked in order.

In an embodiment of the present invention, the chip package further includes an anti-reflection layer located on the bottom surface of the lower substrate.

An aspect of the present invention is to provide a manufacturing method of a chip package.

In an embodiment of the present invention, a manufacturing method of a chip package includes forming a transparent conductive layer on an upper substrate of a wafer structure, wherein the wafer structure has a lower substrate, a bonding layer, a first silicon nitride substrate, a first functional layer, and the upper substrate that are stacked in order, and the bonding layer is located between the lower substrate and the first silicon nitride substrate, and the material of the bonding layer includes Benzocyclobutene (BOB), forming an isolation layer that covers the upper substrate and the transparent conductive layer; forming a first conductive pad in the isolation layer and electrically connected to the transparent conductive layer; and cutting the wafer structure to form a chip package.

In an embodiment of the present invention, the manufacturing method of the chip package further includes forming a second conductive pad on the isolation layer such that the normal projection of the second conductive pad on the upper substrate is spaced apart from the transparent conductive layer.

In an embodiment of the present invention, the manufacturing method of the chip package further includes polishing the upper substrate before forming the transparent conductive layer and forming an anti-reflection layer on the top surface of the upper substrate.

In an embodiment of the present invention, the manufacturing method of the chip package further includes polishing the lower substrate such that the thickness of the lower substrate is greater than that of the upper substrate and forming an anti-reflection layer on the bottom surface of the lower substrate.

In an embodiment of the present invention, the wafer structure further has a second silicon nitride substrate and a second functional layer, the second silicon nitride substrate is located between the bonding layer and the lower substrate, and the second functional layer is located between the lower substrate and the second silicon nitride substrate. The manufacturing method further includes polishing the lower substrate such that the thickness of the lower substrate is smaller than that of the upper substrate and forming an anti-reflection layer on the bottom surface of the lower substrate.

In the aforementioned embodiments of the present invention, since the bonding layer is located between the lower substrate and the first silicon nitride substrate and the material of the bonding layer includes benzocyclobutene (BCB), the bonding layer may not only be formed on the lower substrate and/or the first silicon nitride substrate by coating, but also fill up the space between the lower substrate and the first silicon nitride substrate after bonding. Moreover, the bonding layer is not water-absorbing. As a result, moisture may be prevented from entering the chip package from the area between the lower substrate and the first silicon nitride, and the reliability of the chip package may be improved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
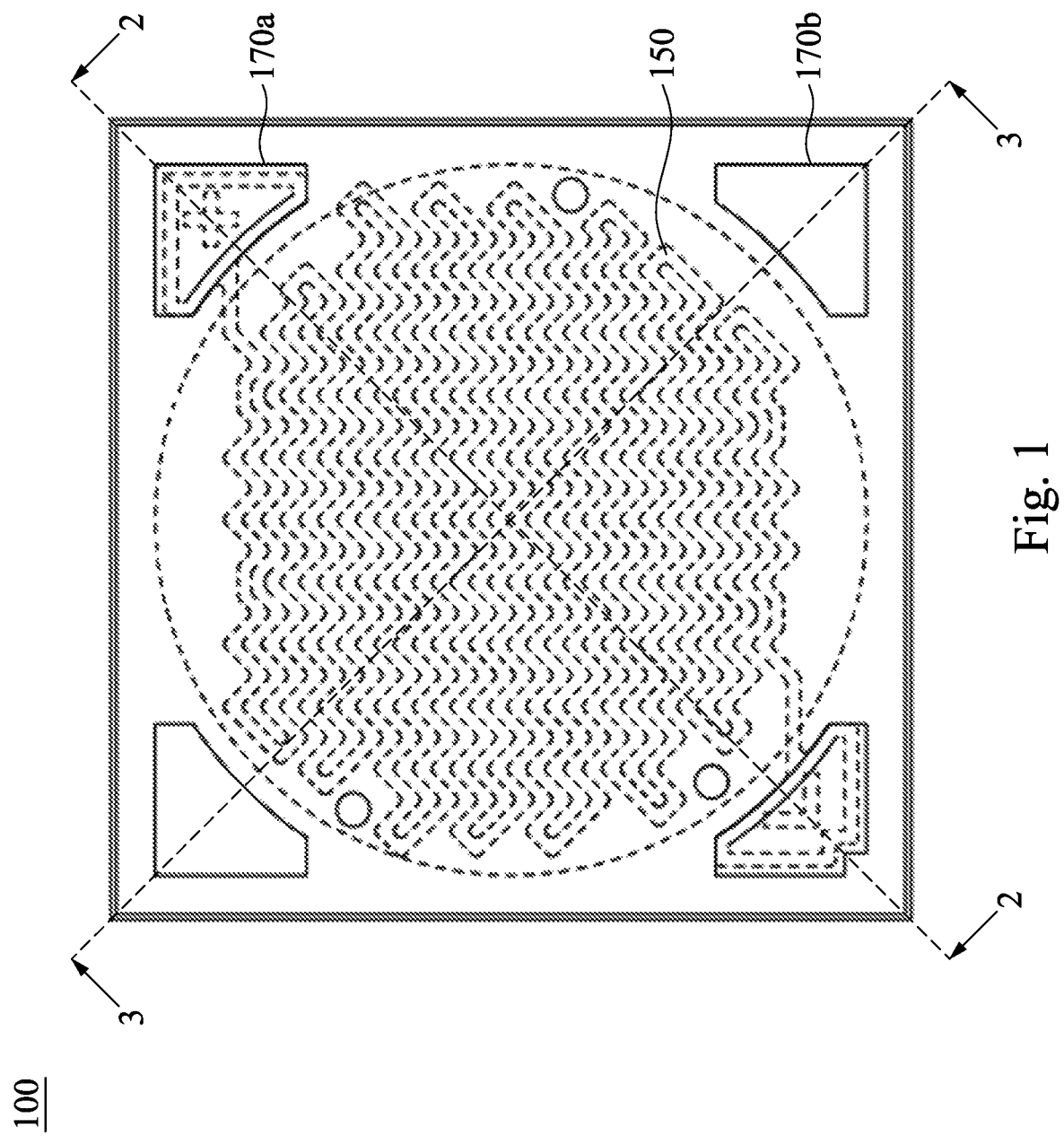
FIG. 1 is a top view of a chip package according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
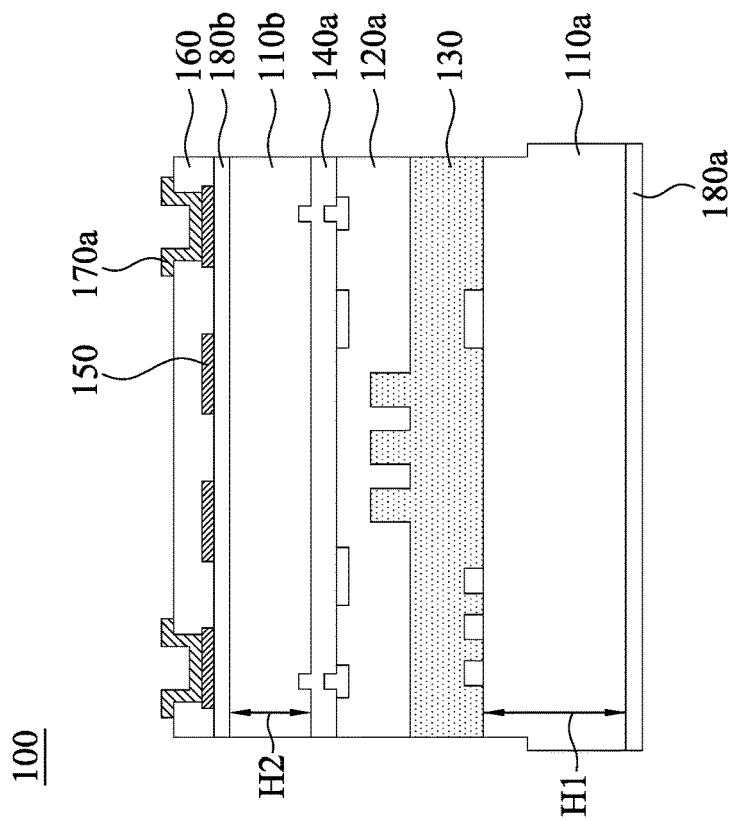
FIG. 2 is a cross-sectional view of the chip package taken along line 2-2 shown in FIG. 1.

FIG. 1 is a top view of a chip package 100 according to one embodiment of the present invention. FIG. 2 is a cross-sectional view of the chip package 100 taken along line 2-2 shown in FIG. 1. As shown in FIG. 1 and FIG. 2, the chip package 100 includes a lower substrate 110a, a first silicon nitride substrate 120a, a bonding layer 130, an upper substrate 110b, a first functional layer 140a, a transparent conductive layer 150, an isolation layer 160, and a first conductive pad 170a. The bonding layer 130 is located between the lower substrate 110a and the first silicon nitride substrate 120a, and made of a material comprising Benzocyclobutene (BCB). The bonding layer 130 fills up the space between the lower 110a and the first silicon nitrate substrate 120a. In this embodiment, the bonding layer 130 contacts the lower substrate 110a and the first silicon nitride substrate 120a. Moreover, the upper substrate 110b is located above the first silicon nitride substrate 120a. The first functional layer 140a is located between the upper substrate 110b and the first silicon nitride substrate 120a. The transparent conductive layer 150 is located on the upper substrate 110b. The isolation layer 160 covers the upper substrate 110b and the transparent conductive layer 150. The first conductive pad 170a is located in the isolation layer 160 and in electrical contact with the transparent conductive layer 150 so that signal may be transmitted. Namely, the first conductive pad 170a overlaps at least a portion of the transparent conductive layer 150.

In this embodiment, the chip package 100 may be applied in field of optics. The first functional layer 140a may have an optical-detecting function. The material of the upper substrate 110b and the material of the lower substrate 110a may include fused silica. There may be circuits in the upper substrate 110b and no circuit in the lower substrate 110a. The material of the transparent conductive layer 150 may include indium tin oxide (ITO). The thickness of the transparent conductive layer 150 may take values between 350 Å and 450 Å, such as 400 Å. The transparent conductive layer 150 is thin in its thickness, and an etchant with a high selection ratio may be used. The material of the isolation layer 160 may include oxides. For instance, the chosen buffered oxide etchant (BOE) may only cause a 2% (8 Å) reduction in thickness of the transparent conductive layer 150 for a 400 Å (30 sec) etching thickness of oxide.

Since the bonding layer 130 is located between the lower substrate 110a and the first silicon nitride substrate 120a and the material of the bonding layer 130 includes benzocyclobutene (BCB), the bonding layer 130 may not only be formed on the lower substrate 110a and/or the first silicon nitride substrate 120a by coating, but also fill up the space between the lower substrate 110a and the first silicon nitride substrate 120a after bonding. Moreover, the bonding layer 130 is not water-absorbing. As a result, moisture may be prevented from entering the chip package 100 from the area between the lower substrate 110a and the first silicon nitride 120a and the reliability of the chip package 100 may be improved.

In this embodiment, since the upper substrate 110b is closer to the first silicon nitride substrate 120a compared to the lower substrate 110a, and the film stress is larger for the side closer to the first silicon nitride substrate 120a, the thickness H2 of the upper substrate 110b is designed thinner to avoid warpage in the chip package 100. In this embodiment, the thickness H1 of the lower substrate 110a is greater than the thickness H2 of the upper substrate 110b. The thickness H1 of the lower substrate 110a may take values between 180 μm and 220 μm, such as 200 μm. The thickness H2 of the upper substrate 110b may take values between 130 μm and 150 μm, such as 140 μm. In this embodiment, a wider dicer (e.g., 130 μm) may be used before a narrower dicer (e.g., 110 μm) so that the bottom of the lower substrate 110a may be slightly bulged, but the present invention is not limited in this regard.

Moreover, the chip package 100 further includes anti-reflection layers 180a and 180b. The anti-reflection layer 180b is located on the top surface of the upper substrate 110b and covered by the isolation layer 160 and the transparent conductive layer 150. The anti-reflection layer 180a is located on the bottom surface of the lower substrate 110a. The anti-reflection layers 180a and 180b may be formed by coating on the top surface of the upper substrate 110b and the bottom surface of the lower substrate 110a, respectively.

Figure 3:
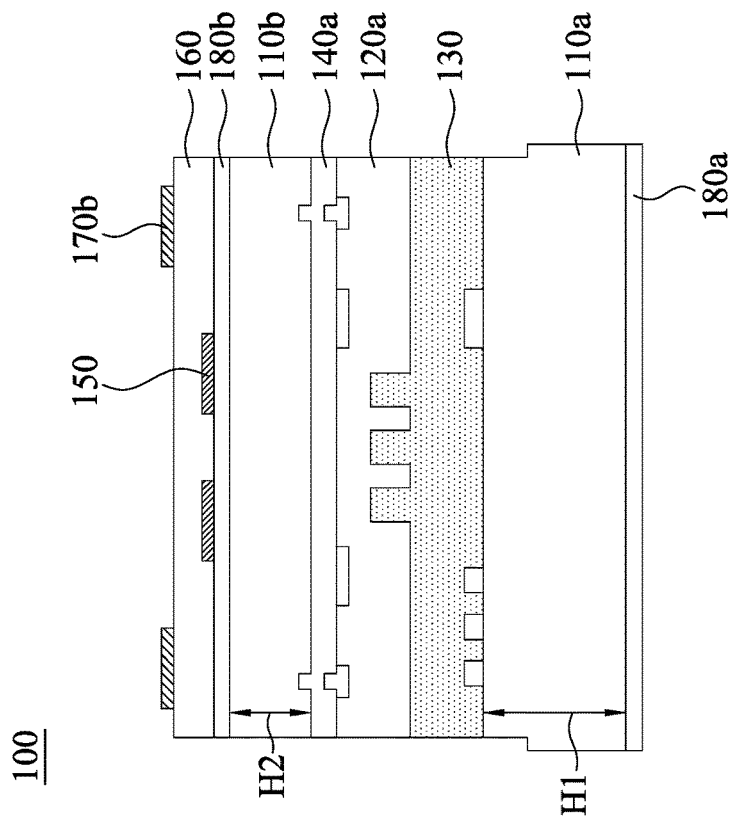
FIG. 3 is a cross-sectional view of the chip package taken along line 3-3 shown in FIG. 1.

FIG. 3 is a cross-sectional view of the chip package 100 taken along line 3-3 shown in FIG. 1. The chip package 100 further includes a second conductive pad 170b. The second conductive pad 170b is located on the isolation layer 160, and the normal projection of the second conductive pad 170b on the upper substrate 110b is spaced apart from the transparent conductive layer 150. Namely, the second conductive pad 170b and the transparent conductive layer 150 are separated by the isolation layer 160, and the second conductive pad 170b is electrically isolated from the transparent conductive layer 150. The second conductive pad 170b and the first conductive pad 170a of FIG. 2 may form simultaneously, but at different locations. As shown in FIG. 1, the first conductive pad 170a and the second conductive pad 170b are located on different corners of the chip package 100, and the transparent conductive layer 150 does not extend to the area below the second conductive pad 170b. The second conductive pad 170b is a dummy pad, and it may be used for weight balance and noise suppression. In this embodiment, the second conductive pad 170b overlaps the transparent conductive layer 150. It avoids the capacitance effect caused by defects in the isolation layer 160 between the second conductive pad 170b and the transparent conductive layer 150 and avoids electrostatic and electrical stress to damage the chip package 100, and then improve product reliability.

It is to be noted that the connection relationship, materials, and advantages of the aforementioned elements will not be repeated. In the following description, a manufacturing method of the chip package 100 will be described.

Figure 4:
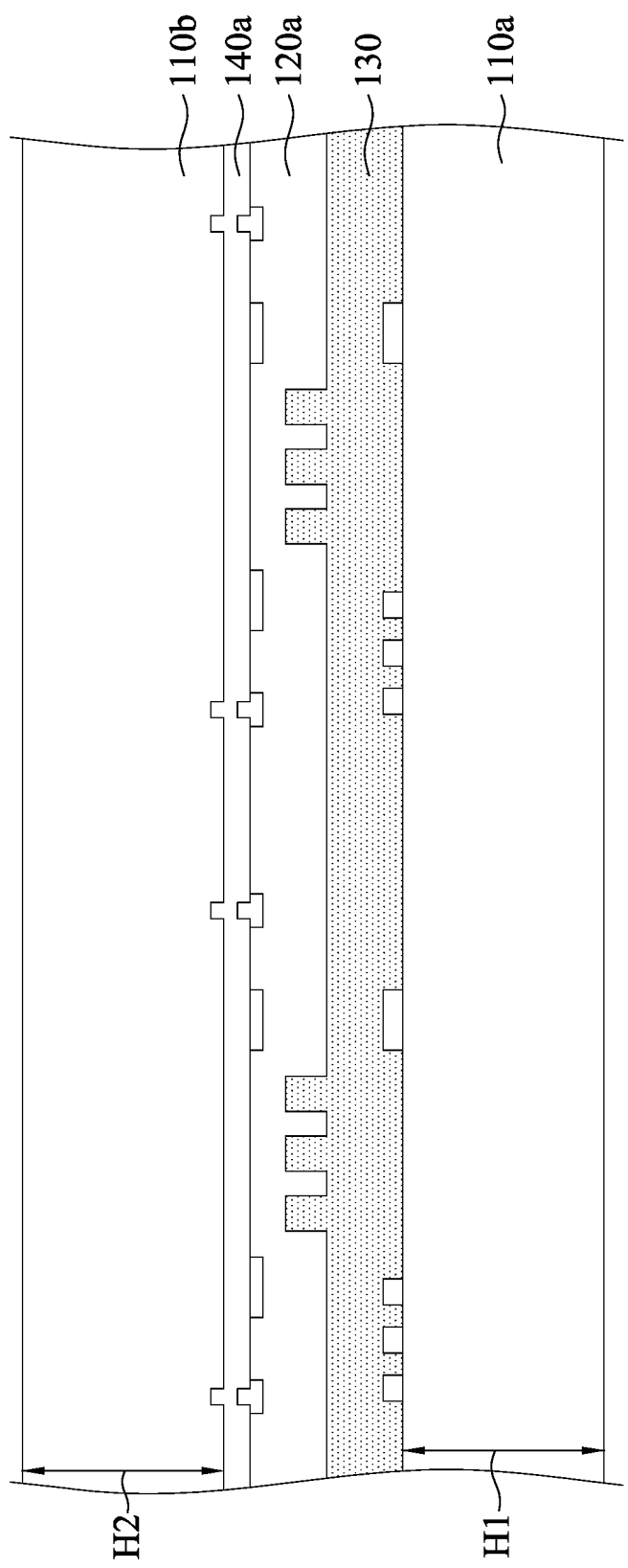
FIG. 4 to FIG. 11 are cross-sectional views at various stages of a manufacturing method the chip package of FIG. 1.
Figure 5:
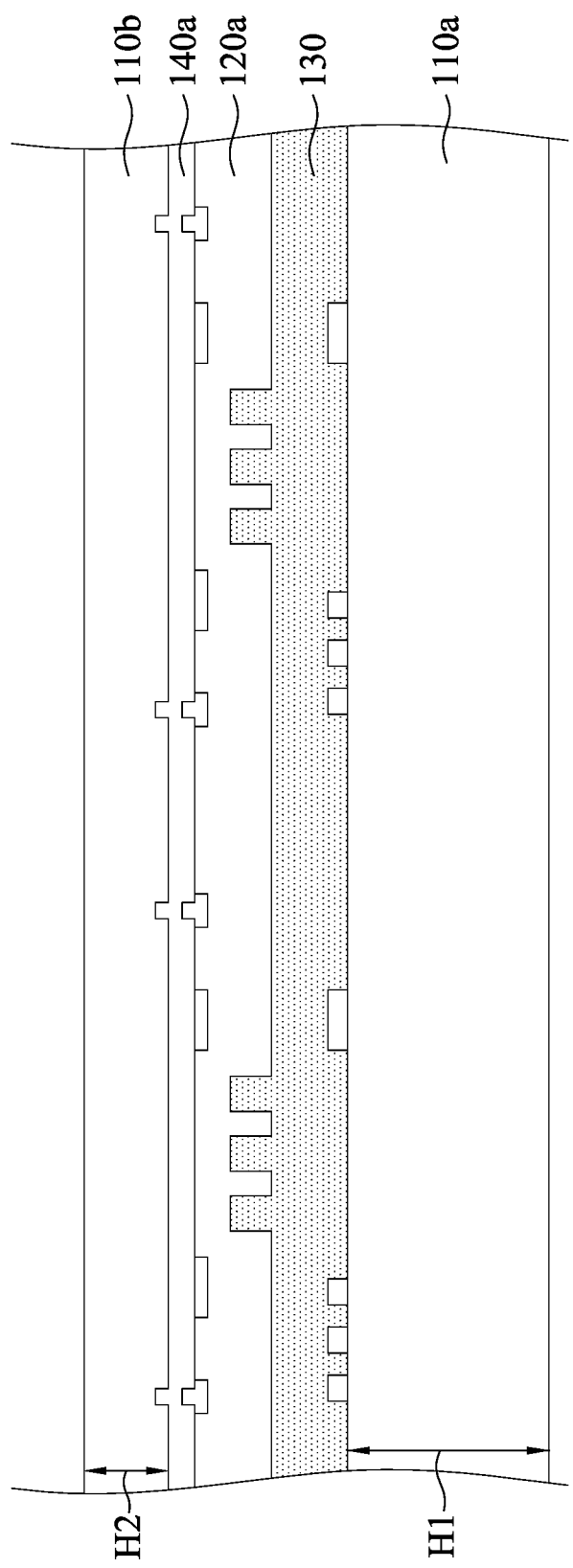
Figure 6:
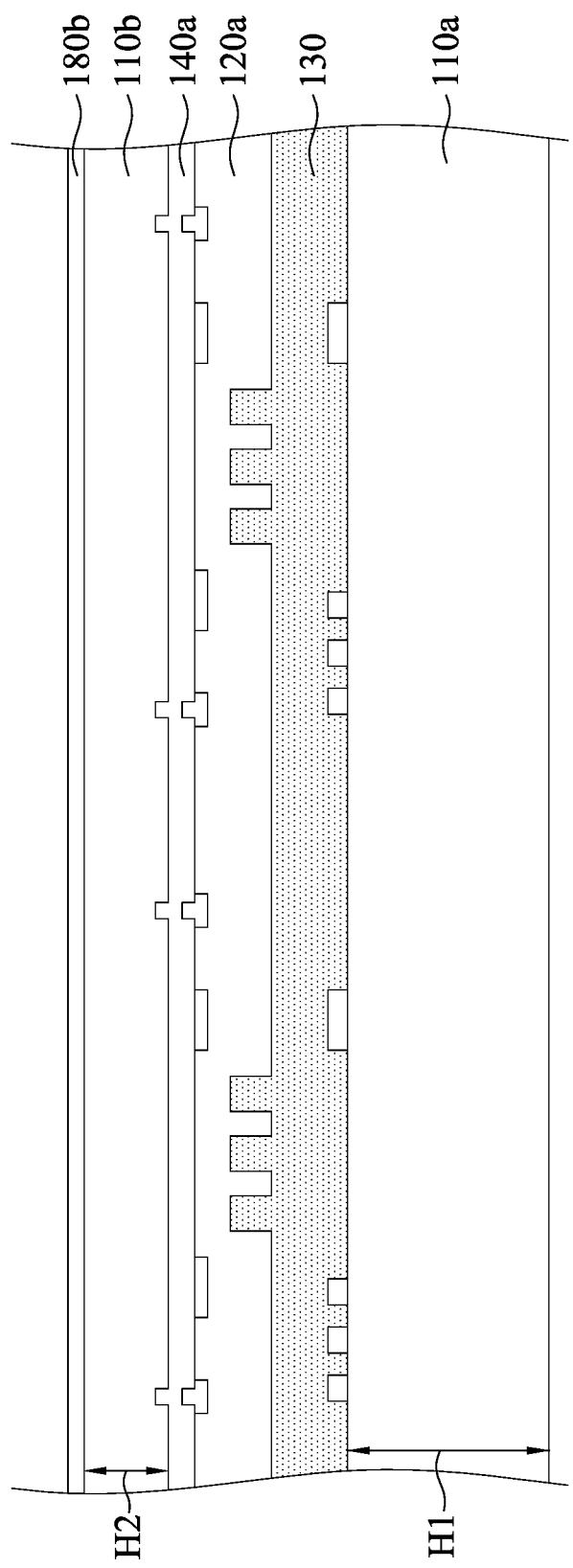

FIG. 4 to FIG. 11 are cross-sectional views of the chip package 100 shown in FIG. 1 in different manufacturing stages. As shown in FIG. 4, the wafer structure 200 has the lower substrate 110a, the bonding layer 130, the first silicon nitride substrate 120a, the first functional layer 140a, and the upper substrate 110b that are stacked in order, wherein the bonding layer 130 is located between the lower substrate 110a and the first silicon nitride substrate 120a, and a material of the bonding layer 130 includes Benzocyclobutene (BCB). The thickness H1 of the lower substrate 110a and the thickness H2 of the upper substrate 110b may be about 500 μm, but the sizes of the lower substrate 110a and the upper substrate 110b are not limited to the example provided herein. As shown in FIG. 5, the upper substrate 110b is polished such that the thickness H2 of the upper substrate 110b reduces from 500 μm to about 140 μm, but the present invention is not limited in this regard. As shown in FIG. 6, the anti-reflection layer 180b is then formed on the top surface of the upper substrate 110b.

Figure 7:
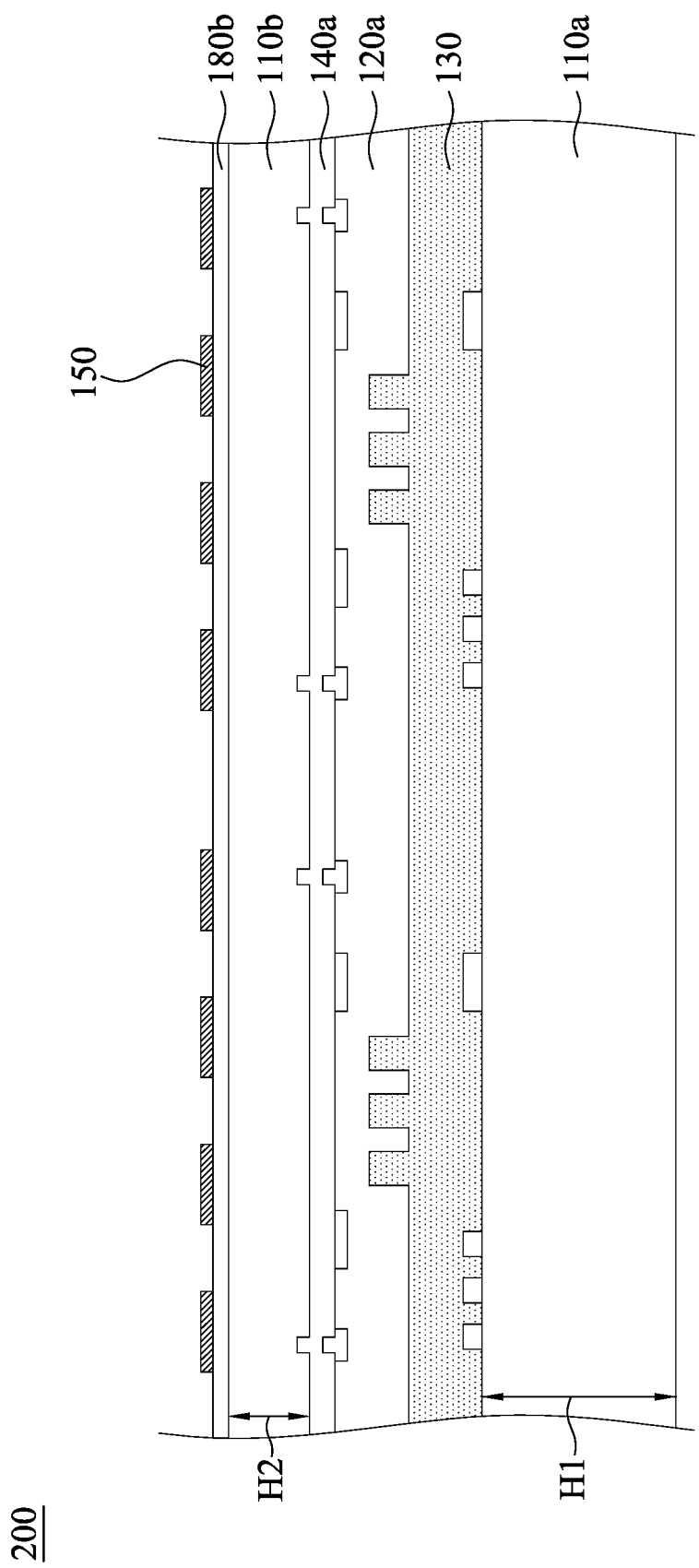
Figure 8:
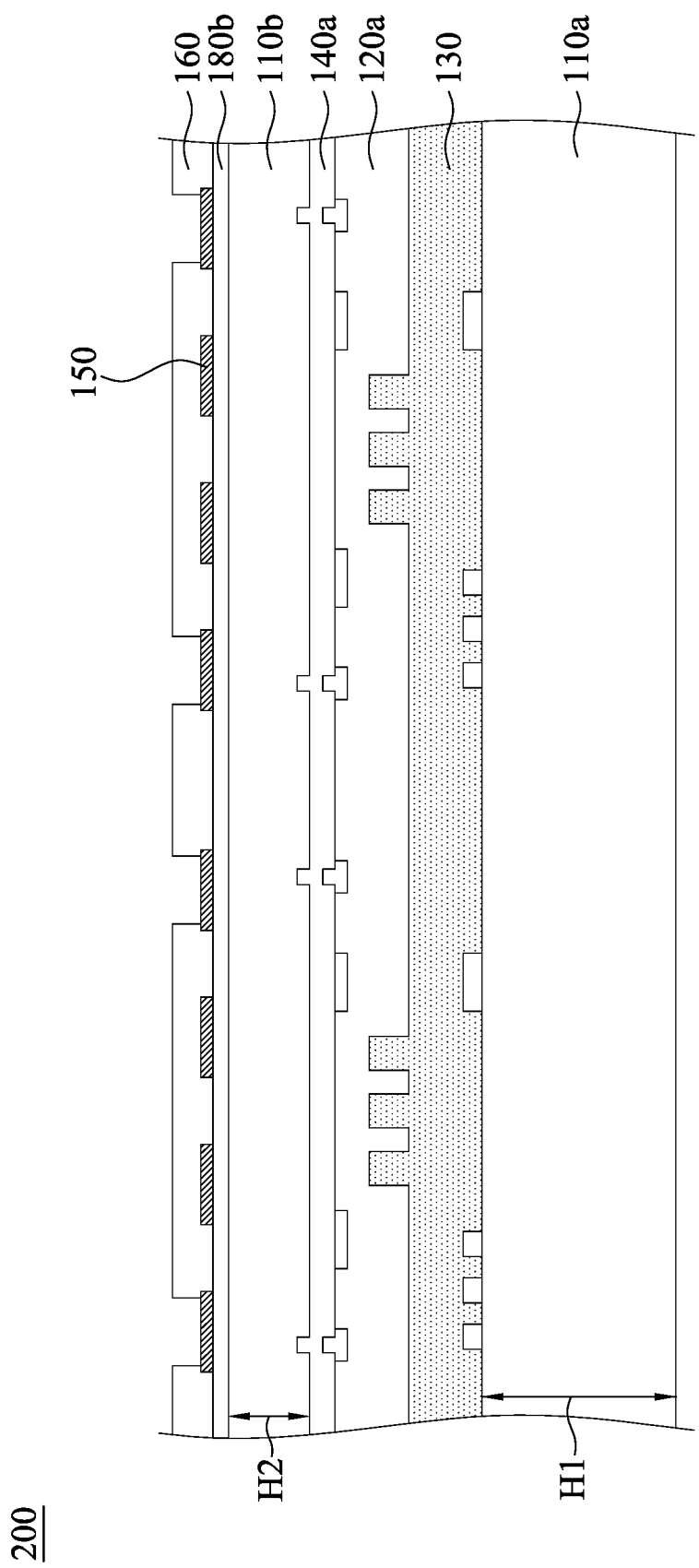

As shown in FIG. 7, after the anti-reflection layer 180b is formed, the transparent conductive layer 150 is formed on the anti-reflection layer 180b on the upper substrate 110b. Then, as shown in FIG. 8, the isolation layer 160 is formed, covering the upper substrate 110b and the transparent conductive layer 150. The isolation layer 160 may be patterned to form an opening so that the transparent conductive layer 150 is exposed. In this embodiment, the exposed transparent conductive layer 150 may be used to electrically connect the first conductive pad 170a formed subsequently.

Figure 9:
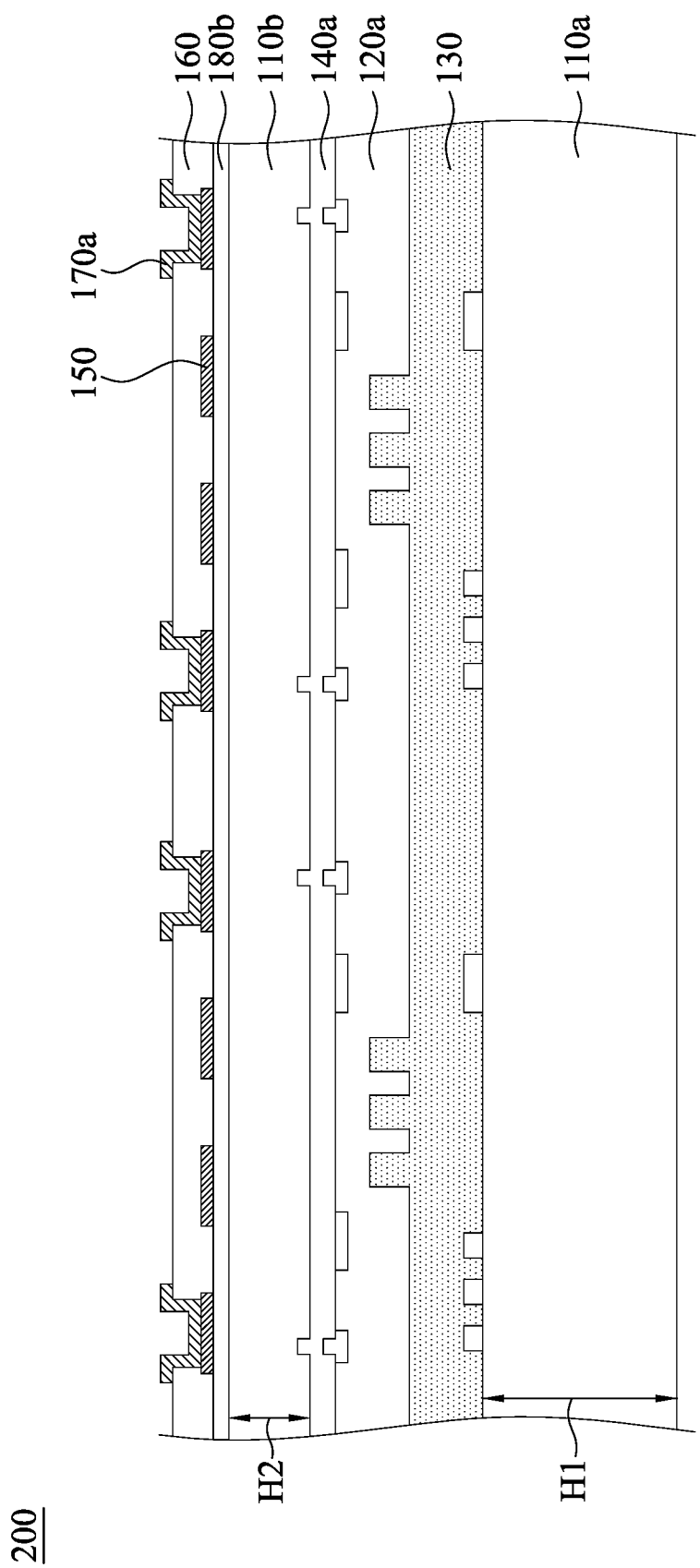

As shown in FIG. 9, then the first conductive pad 170a is formed in the isolation layer 160 and electrically connects to the transparent conductive layer 150. In this step, the second conductive pad 170b shown in FIG. 3 may be simultaneously formed on the isolation layer 160, but the second conductive pad 170b is spaced apart from the transparent conductive layer 150 by the isolation layer 160, and the normal projection of the second conductive pad 170b is spaced apart from the transparent conductive layer 150.

Figure 10:
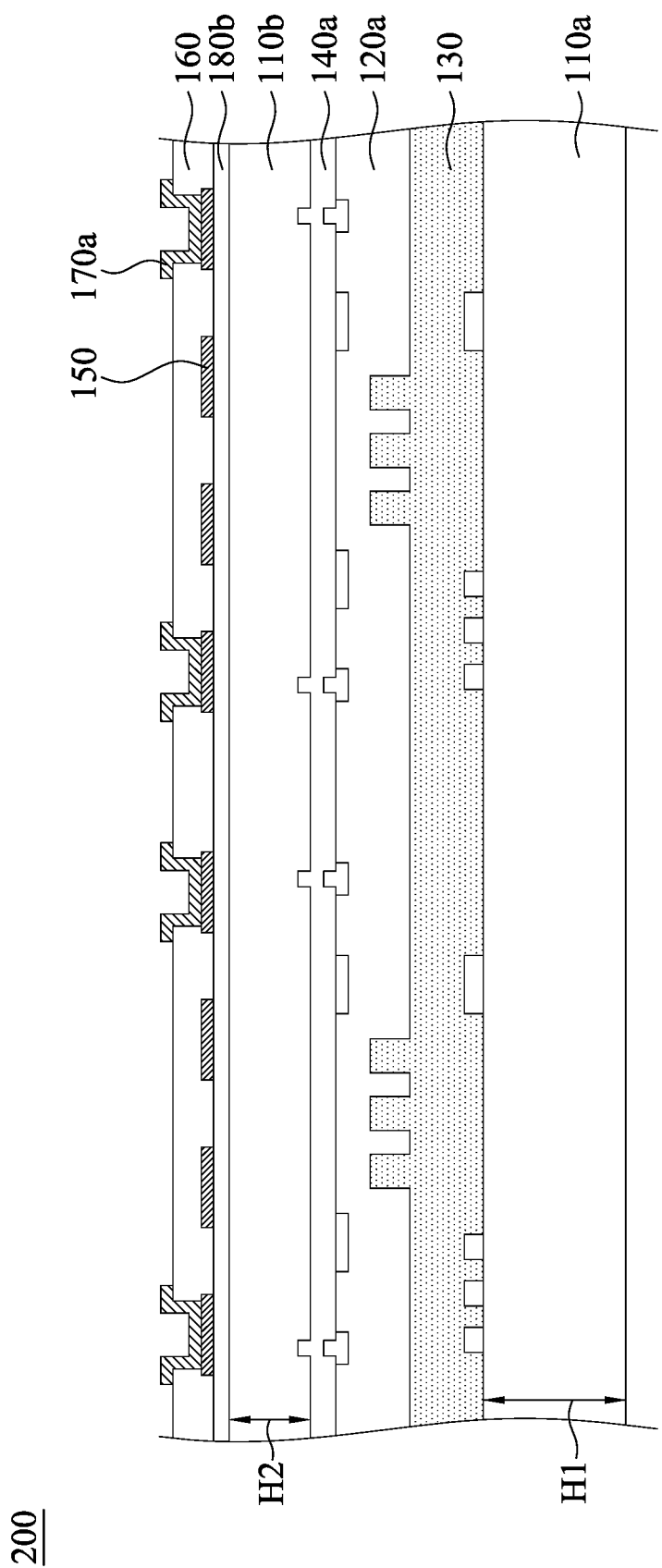

As shown in FIG. 10, after the first conductive pad 170a and the second conductive pad 170b (see FIG. 3) are formed, the lower substrate 110a is polished so that the thickness H1 of the lower substrate 110a reduces from 500 μm to about 200 μm, but the present invention is not limited in this regard. As a result, the thickness H1 of the lower substrate 110a is still greater than the thickness H2 of the upper substrate 110b. Since the film stress is larger for the side closer to the first silicon nitride substrate 120a, the upper substrate 110b is designed thinner than the lower substrate 110a to avoid warpage.

Figure 11:
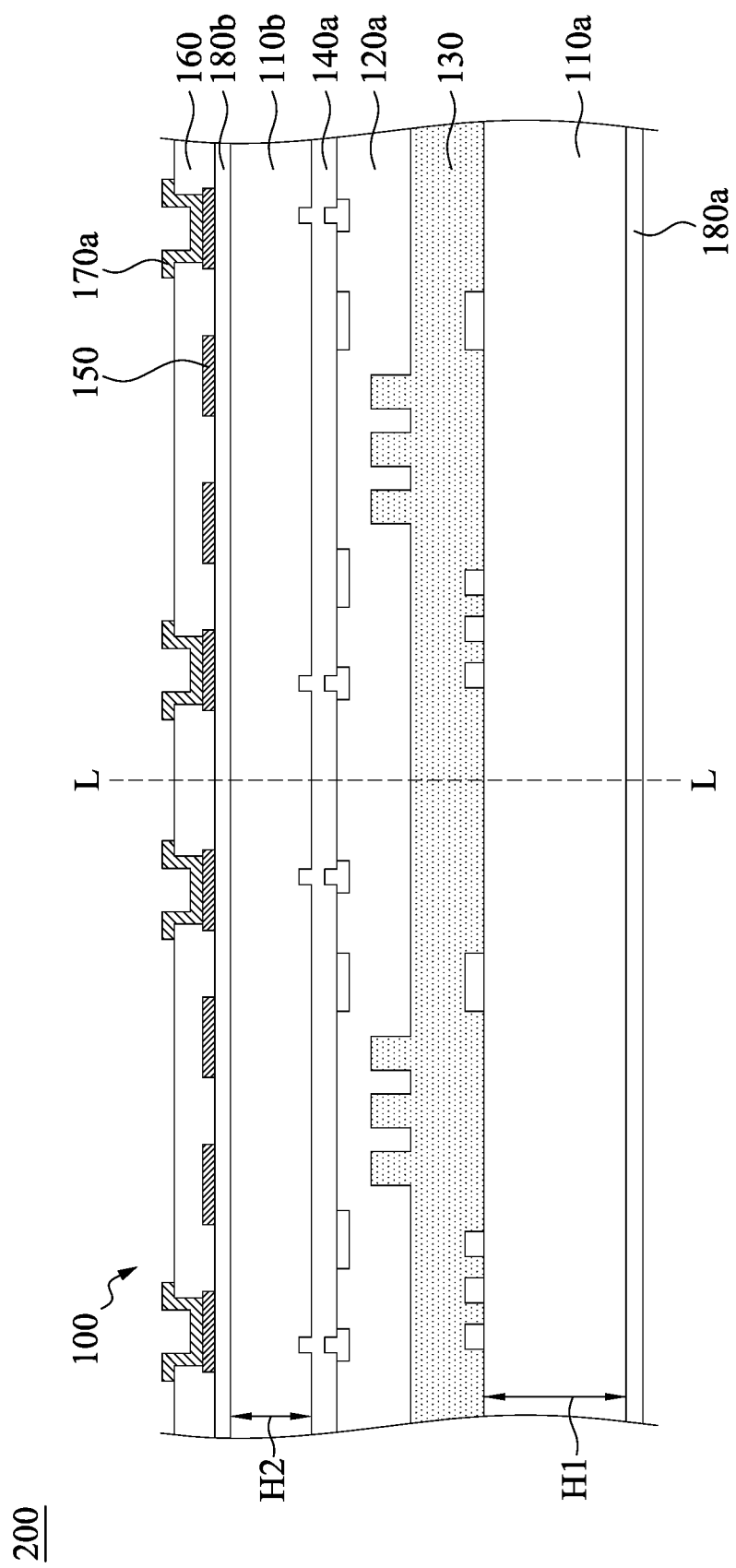

As shown in FIG. 11, the anti-reflection layer 180a is then formed on the bottom surface of the lower surface 110a. After the anti-reflection layer 180a is formed, the wafer structure 200 may be diced along line L to obtain the chip package 100 of FIG. 2.

Figure 12:
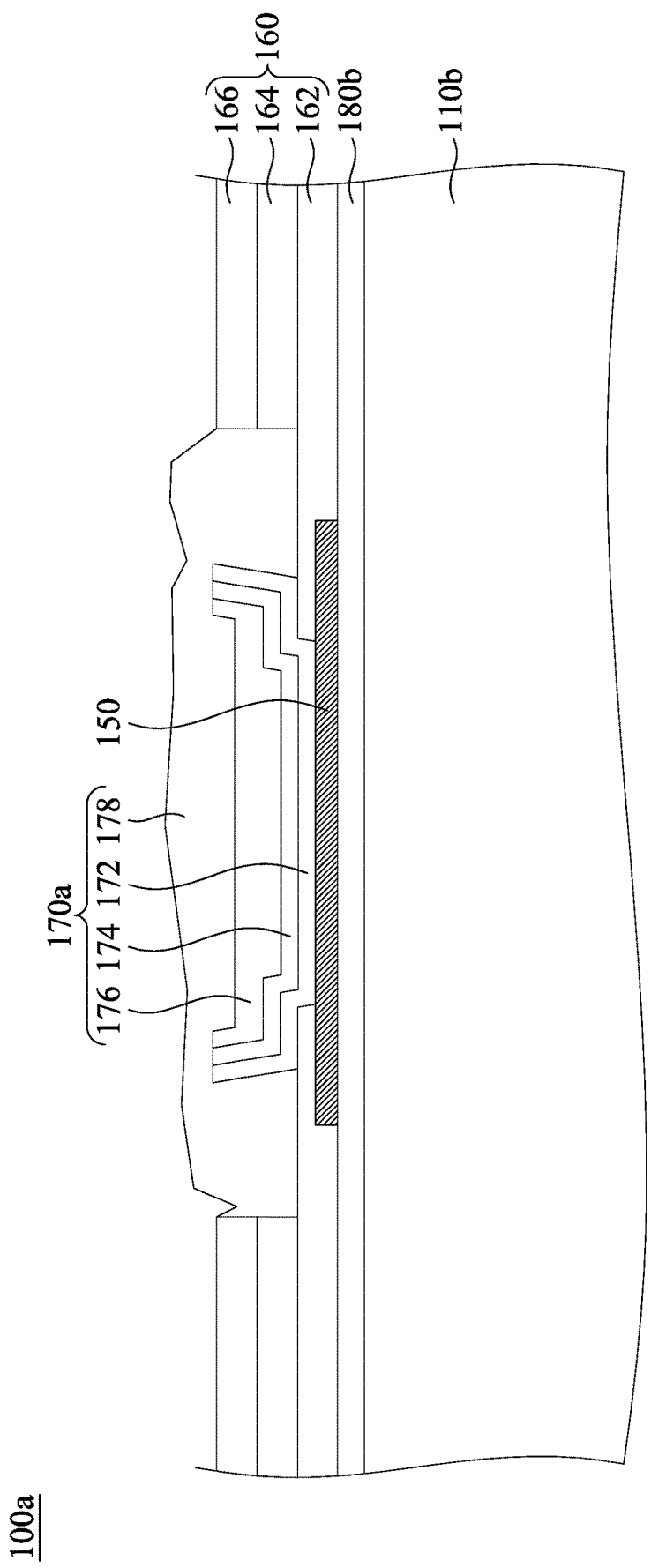
FIG. 12 is a partially cross-sectional view of a chip package according to one embodiment of the present invention.

FIG. 12 is a part of a cross-sectional view of the chip package 100a according to an embodiment of the invention. The first conductive pad 170a of the chip package 100a includes a titanium nitride layer 172, a titanium layer 174, a gold layer 176, and a silver (Ag) epoxy 178 that are stacked in order, and all of the layers mentioned above do not extend to the top surface of the isolation layer 160, avoiding the silver epoxy to spillover and to cause risk of short circuit. In this embodiment, the isolation layer 160 of the chip package 100a includes a tetraethyl orthosilicate (TEOS) oxide layer 162, a silicon nitride layer 164, and an oxide layer 166 that are stacked in order. The first conductive pad 170a and the isolation layer 160 may be applied in the chip package 100 mentioned above, but the present invention is not limited in this regard.

Figure 13:
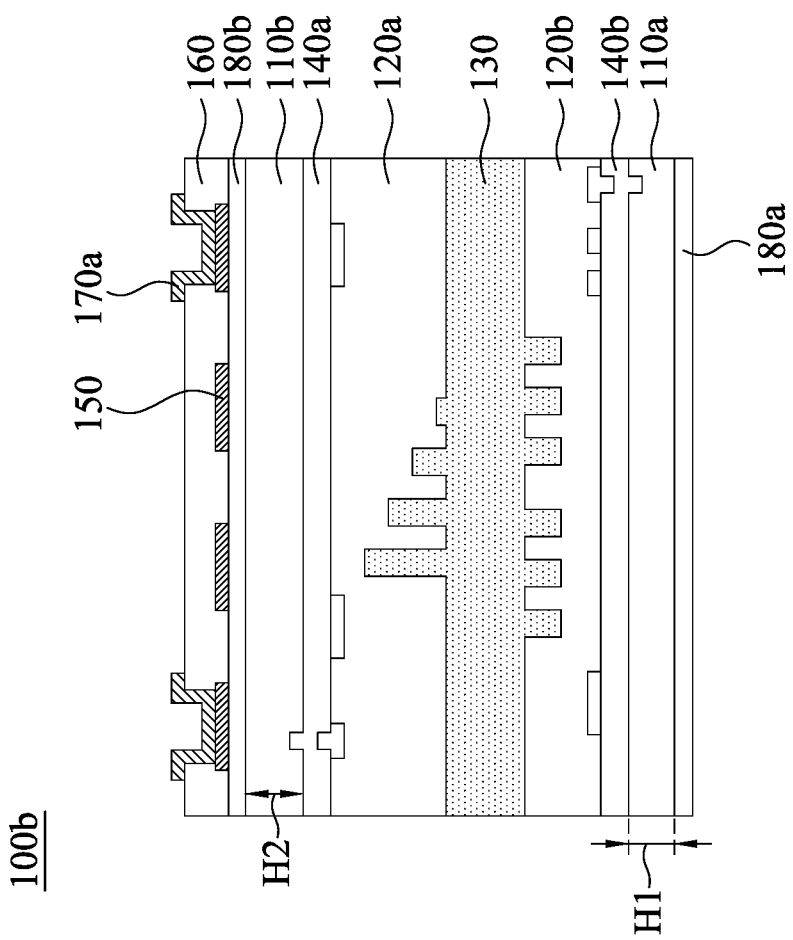
FIG. 13 is a cross-sectional view of a chip package according to another embodiment of the present invention.

FIG. 13 is a cross-sectional view of the chip package 100b according to another embodiment of the invention. The chip package 100b includes a lower substrate 110a, a first silicon nitride substrate 120a, a bonding layer 130, an upper substrate 110b, a first functional layer 140a, a transparent conductive layer 150, an isolation layer 160, and a first conductive pad 170a. The differences between the chip package 100b of FIG. 13 and the chip package 100 of FIG. 2 are described below. The chip package 100b further includes the second silicon nitride substrate 120b and the second functional layer 140b, and the thickness H1 of the chip package 100a is lesser than the thickness H2 of the upper substrate 110b. The second silicon nitride substrate 120b of the chip package 100b is located between the bonding layer 130 and the lower substrate 110a. The second functional layer 140b is located between the lower substrate 110a and the second silicon nitride substrate 120b. The bonding layer 130 of the chip package 100b fills up the space between the second silicon nitride substrate 120b and the first silicon nitride substrate 120a. Moreover, the chip package 100b may have the second conductive pad 170b of FIG. 3.

In this embodiment, the film stress is larger for the side closer to the second silicon nitride substrate 120b. Since the lower substrate 110a is closer to the first silicon nitride substrate 120a compared to the upper substrate 110b, the thickness H1 of the lower substrate 110a is designed thinner to avoid warpage in the chip package 100b. The thickness H1 of the lower substrate 110a may take values between 180 μm and 1900 μm, such as 186.5 μm. The thickness H2 of the upper substrate 110b may take values between 180 μm and 220 μm, such as 200 μm.

The manufacturing method of the chip package 100b is similar to the manufacturing method of the chip package 100 above, and the difference is in the thickness of polishing of the upper substrate 110b and the thickness of polishing of the lower substrate 110a. For instance, the manufacturing method of the chip package 100b includes polishing the upper substrate 110b so that the thickness H2 of the upper substrate 110b reduces from 500 μm to about 200 μm and polishing the lower substrate 110a so that the thickness H1 of the upper substrate 110b reduces from 500 μm to about 186.5 μm. As a result, the thickness H1 of the lower substrate 110a is less than the thickness H2 of the upper substrate 110b.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing form the scope or spirit of the invention. In view of the foregoing, it is intended that the present invention covers modifications and variations of this invention provided they fall within the scope of the following claims.

What is claimed is:

1. A chip package, comprising:
    a lower substrate;
    a first silicon nitride substrate;
    a bonding layer located between the lower substrate and the first silicon nitride substrate, and made of a material comprising Benzocyclobutene (BCB)
    an upper substrate located on the first silicon nitride substrate;
    a first functional layer located between the upper substrate and the first silicon nitride substrate;
    a transparent conductive layer located on the upper substrate;
    an isolation layer covering the upper substrate and the transparent conductive layer;
    a first conductive pad located in the isolation layer and in electrical contact with the transparent conductive layer; and
    a second conductive pad located on the isolation layer, wherein a normal projection of the second conductive pad on the upper substrate is spaced apart from the transparent conductive layer, and the second conductive pad is electrically isolated from the transparent conductive layer.

2. The chip package of claim 1, wherein the bonding layer fills up a space between the lower substrate and the first silicon nitride substrate.

3. The chip package of claim 1, wherein the bonding layer contacts the lower substrate and the first silicon nitride substrate.

4. The chip package of claim 1, wherein the second conductive pad and the transparent conductive layer are separated by the isolation layer.

5. The chip package of claim 1, wherein a thickness of the lower substrate is greater than that of the upper substrate.

6. The chip package of claim 1, further comprising:
    a second silicon nitride substrate located between the bonding layer and the lower substrate; and
    a second functional layer located between the lower substrate and the second silicon nitride substrate.

7. The chip package of claim 1, further comprising:
    an anti-reflection layer located on a top surface of the upper substrate and covered by the isolation layer and the transparent conductive layer.

8. The chip package of claim 1, wherein a material of the upper substrate and a material of the lower substrate comprise fused silica.

9. The chip package of claim 1, wherein the isolation layer comprises a tetraethyl orthosilicate (TEOS) oxide layer, a silicon nitride layer, and an oxide layer that are stacked in order.

10. The chip package of claim 1, further comprising:
    an anti-reflection layer located on a bottom surface of the lower substrate.

11. The chip package of claim 6, wherein the bonding layer fills up a space between the second nitride substrate and the first nitride substrate.

12. The chip package of claim 6, wherein a thickness of the lower substrate is smaller than that of the upper substrate.

13. A chip package, comprising:
    a lower substrate;
    a first silicon nitride substrate;
    a bonding layer located between the lower substrate and the first silicon nitride substrate, and made of a material comprising Benzocyclobutene (BCB)
    an upper substrate located on the first silicon nitride substrate;
    a first functional layer located between the upper substrate and the first silicon nitride substrate;
    a transparent conductive layer located on the upper substrate;
    an isolation layer covering the upper substrate and the transparent conductive layer; and
    a first conductive pad located in the isolation layer and in electrical contact with the transparent conductive layer, wherein the first conductive pad comprises a titanium nitride layer, a titanium layer, a gold layer, and a silver (Ag) epoxy that are stacked in order.

14. A manufacturing method of a chip package, comprising:
    forming a transparent conductive layer on an upper substrate of a wafer structure, wherein the wafer structure has a lower substrate, a bonding layer, a first silicon nitride substrate, a first functional layer, and the upper substrate that are stacked in order, wherein the bonding layer is located between the lower substrate and the first silicon nitride substrate, and a material of the bonding layer comprises Benzocyclobutene (BCB);
    forming an isolation layer that covers the upper substrate and the transparent conductive layer;
    forming a first conductive pad in the isolation layer and electrically connected to the transparent conductive layer;
    forming a second conductive pad on the isolation layer, wherein a normal projection of the second conductive pad on the upper substrate is spaced apart from the transparent conductive layer, and the second conductive pad is electrically isolated from the transparent conductive layer; and
    cutting the wafer structure to form a chip package.

15. The manufacturing method of the chip structure of claim 14, further comprising:
    polishing the upper substrate before forming the transparent conductive layer; and
    forming an anti-reflection layer on a top surface of the upper substrate.

16. The manufacturing method of the chip structure of claim 14, further comprising:
- polishing the lower substrate such that a thickness of the lower substrate is greater than that of the upper substrate; and
- forming an anti-reflection layer on a bottom surface of the lower substrate.

17. The manufacturing method of the chip structure of claim 14, wherein the wafer structure further has a second silicon nitride substrate and a second functional layer, the second silicon nitride substrate is located between the bonding layer and the lower substrate, and the second functional layer is located between the lower substrate and the second silicon nitride substrate, the manufacturing method further comprising:
- polishing the lower substrate such that a thickness of the lower substrate is smaller than that of the upper substrate; and
- forming an anti-reflection layer on a bottom surface of the lower substrate.

* * * * *